United States Patent
Kimura et al.

(10) Patent No.: US 12,352,858 B2
(45) Date of Patent: Jul. 8, 2025

(54) OPTICAL DISTANCE MEASURING APPARATUS

(71) Applicant: DENSO CORPORATION, Kariya (JP)

(72) Inventors: Teiyu Kimura, Kariya (JP); Noriyuki Ozaki, Kariya (JP); Takehiro Hata, Kariya (JP); Mineki Soga, Nagakute (JP); Hiroyuki Matsubara, Nagakute (JP); Isamu Takai, Nagakute (JP)

(73) Assignee: DENSO CORPORATION, Kariya (JP)

( * ) Notice: Subject to any disclaimer, the term of this patent is extended or adjusted under 35 U.S.C. 154(b) by 1001 days.

(21) Appl. No.: 17/401,014

(22) Filed: Aug. 12, 2021

(65) Prior Publication Data

US 2021/0373156 A1 Dec. 2, 2021

Related U.S. Application Data

(63) Continuation of application No. PCT/JP2020/005342, filed on Feb. 12, 2020.

(30) Foreign Application Priority Data

Feb. 15, 2019 (JP) .............................. JP2019-025312

(51) Int. Cl.
*G01S 7/4861* (2020.01)
*G01S 7/484* (2006.01)
(Continued)

(52) U.S. Cl.
CPC .............. *G01S 17/08* (2013.01); *G01S 7/484* (2013.01); *G01S 7/4861* (2013.01); *G01S 17/931* (2020.01)

(58) Field of Classification Search
CPC ........ G01S 17/08; G01S 17/931; G01S 17/42; G01S 7/484; G01S 7/4861; G01S 7/4863;
(Continued)

(56) References Cited

U.S. PATENT DOCUMENTS

2013/0120734 A1* 5/2013 Ogata .................... G01S 7/4816
356/4.01
2015/0268331 A1* 9/2015 Koehler .................. G01S 7/497
356/5.01

(Continued)

FOREIGN PATENT DOCUMENTS

JP 2013-096905 A 5/2013

*Primary Examiner* — Sang H Nguyen
(74) *Attorney, Agent, or Firm* — Maschoff Brennan (57) ABSTRACT

An optical distance measuring apparatus comprises a laser diode emitting a light pulse, light receiver including a photon-counting light receiver, distance measurement unit including a signal discriminator and propagation estimator, and threshold determiner. The signal discriminator discriminates the signal component, exceeding a threshold, of the signal as a reflected signal resulting from reflection of the light pulse at a measurement object. The propagation estimator estimates a round-trip propagation time of the light pulse to the measurement object using the signal. The threshold determiner sets a boundary level as the threshold, corresponding to a reference level obtained from the signal when the signal discriminator determines the reflected signal, using the relationship between the reference and the boundary level. The reference level is obtained from the average value of a noise probability distribution in the signal. The boundary level represents a predetermined cumulative probability in the noise probability distribution.

11 Claims, 5 Drawing Sheets

(51) Int. Cl.
*G01S 17/08* (2006.01)
*G01S 17/931* (2020.01)

(58) Field of Classification Search
CPC . G01S 7/4865; G01J 1/42; G01C 3/06; H10F 30/20; H10F 30/225
See application file for complete search history.

(56) References Cited

U.S. PATENT DOCUMENTS

| | | | |
|---|---|---|---|
| 2017/0356796 A1 | 12/2017 | Nishio | |
| 2018/0149753 A1* | 5/2018 | Shin | G01S 7/4811 |
| 2018/0356502 A1* | 12/2018 | Hinderling | G01S 7/4818 |
| 2019/0086539 A1* | 3/2019 | Shin | G01S 7/4813 |
| 2020/0056937 A1 | 2/2020 | Nishio | |

* cited by examiner

MEASUREMENT DIRECTION OF PHOTODETECTOR FOR TOF MEASUREMENT 18a IN SUCCEEDING RECEIVING LIGHT (MEASUREMENT DIRECTION OF PHOTODETECTOR FOR NOISE MEASUREMENT 18b IN CURRENT RECEIVING LIGHT)

MEASUREMENT DIRECTION OF PHOTODETECTOR FOR TOF MEASUREMENT 18a IN CURRENT RECEIVING LIGHT

OPTICAL DISTANCE MEASURING APPARATUS

CROSS-REFERENCE TO RELATED APPLICATION

The present application is a continuation application of International Application No. PCT/JP2020/005342, filed Feb. 12, 2020, which claims priority to Japanese Patent Application No. 2019-25312 filed on Feb. 15, 2019. The contents of these applications are incorporated herein by reference in their entirety.

BACKGROUND

1. Technical Field

The present disclosure relates to an optical distance measuring apparatus.

2. Related Art

Movable bodies (vehicles, etc.) equipped with a collision prevention system have been developed for reducing occurrence of traffic accidents or the like. In such a system, an environment sensor equipped with a camera, a millimeter-wave radar or the like is used for observing an external environment.

The optical distance measuring apparatus using time-of-flight method (TOF: Time Of Flight) has a high spatial resolution (angular resolution) and can measure a wide angular range and a large range of distances. These functions can improve the detection accuracy and robustness of roadways and obstacles, and therefore, the expansion of the functions for a safety system can be expected. For example, detection of an obstacle, which is located farther away, with high positional accuracy enables an early warning. In addition, detection of a surrounding environment, such as the shape of a parked vehicle, with high accuracy enables collision with the other and going through the narrow lane to be detected with high reliability.

SUMMARY

The present disclosure provides an optical distance measuring apparatus. As an aspect of the present disclosure, the optical distance measuring apparatus includes a light emitting means, light receiving means, signal discrimination means, propagation estimation means and threshold setting means. The light emitting means emits an output light beam to a measurement object. The light receiving means receives a light beam to output a light receiving signal. The signal discrimination means discriminates a signal component, exceeding a threshold, from received signal components of the light receiving signal as a reflected signal. The propagation estimation means estimates a round-trip propagation time of the output light beam to the measurement object based on the reflected signal. The threshold setting means sets a boundary level as the threshold, which corresponds to a reference level obtained from the light receiving signal based on a relationship between the reference level and the boundary level. The reference level is obtained from an average value of a probability distribution of a noise included in the light receiving signal. The boundary level has a cumulative probability in the noise probability distribution which has a predetermined value.

DETAILED DESCRIPTION OF THE PREFERRED EMBODIMENTS

An avalanche photodiode (APD) or a PIN photodiode is often used as the light-receiving element of the optical distance measuring apparatus using the TOF. The incidence of photons into the APD generates electron-hole pairs, and the electrons and the holes are each accelerated in a high electric field, thereby producing a collision ionization to generate new electron-hole pairs, that is, an avalanche phenomenon occurs. The internal amplification action of the avalanche phenomenon can increase the detection sensitivity of the light receiving element. Operation modes of the APD include a linear mode and a Geiger mode. The linear mode is when an applied reverse bias voltage is less than a breakdown voltage. On the other hand, the Geiger mode is when the applied reverse bias voltage is at the breakdown voltage or higher. In the linear mode, the proportion of the electron-hole pairs which disappear (exit from a high electric field) is larger than that of the generated electron-hole pairs, and thereby the avalanche phenomenon is spontaneously stopped. An output current in the operation mode of the APD is approximately proportional to the quantity of incident light, and therefore, the quantity of incident light can be measured by the output current. The APD operated in the Geiger mode is also referred to as a "single photon avalanche diode (SPAD)", because the avalanche phenomenon can be caused even by the incidence of a single photon into the APD. The SPAD enables the avalanche phenomenon to stop by decreasing the applied voltage to less than the breakdown voltage. Lowering the applied voltage to stop the avalanche phenomenon is referred to as "quenching". Connection of the SPAD with a quenching resistance in series provides the simplest quenching circuit. In occurrence of an avalanche current, a voltage rise resulting from between the respective ends of the quenching resistance leads to decreasing the bias voltage of the SPAD. When the bias voltage of the SPAD is decreased to less than the breakdown voltage, the avalanche current is not produced. In response, a voltage generated, between the respective ends of the quenching resistance, is decreased, and a voltage, which is the breakdown voltage or higher, is applied to the SPAD again. By extracting this voltage increase and decrease of the SPAD and that resulting from between the respective ends of the quenching resistance, via a buffer, a photon incidence is output as a voltage pulse. Thus, a light receiving element, which detects the presence or absence of the photon incidence, is referred to as a "photon-counting light receiving element".

Figure 2:
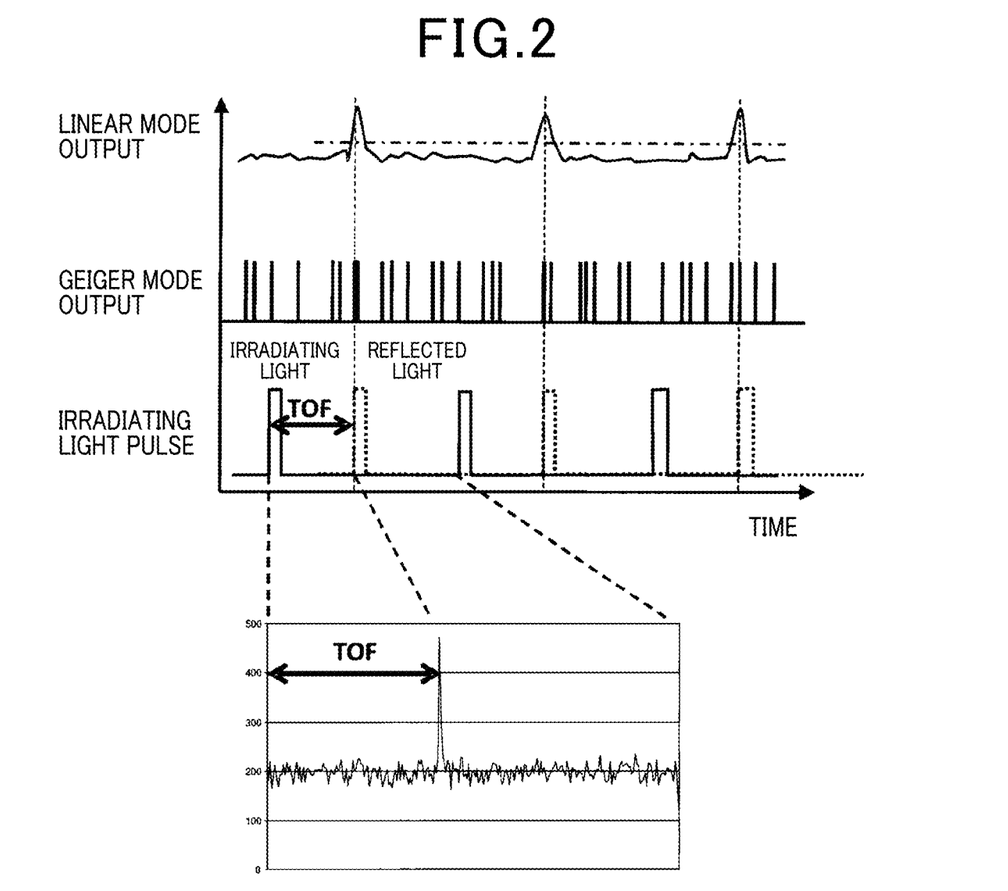
FIG. 2 is a diagram illustrating a method of obtaining a TOF of the optical distance measuring apparatus in the embodiment of the present disclosure.

A method for calculating the TOF, in which the APD operated in the linear mode and the APD operated in the Geiger mode are each used as the light receiving element, are shown in FIG. 2. The optical distance measuring apparatus irradiates repeatedly a pulsed light beam to an object. The light receiving element receives a light beam obtained by adding a pulsed light beam reflected by the object to a disturbance light such as a sunlight. When using a light receiving element, such as an APD operated in the linear mode, which outputs a current being approximately proportional to the quantity of incident light, the peak of a light receiving signal is extracted after eliminating the direct-current component of the light receiving signal. On the other hand, when using the photon-counting light receiving element, such as an APD operated in the Geiger mode, an arrival time of the voltage pulse is repeatedly measured. After this, a histogram is created to extract the peak thereof. The photons of the reflected pulsed light beam arrive at the light receiving element at the same time. On the other hand, the photons of the disturbance light arrive randomly at the light receiving element, and therefore, if the disturbance light exists, TOF detection can be performed accurately by extracting the peak of a light receiving signal. The light receiving signal, which is received using the APD operated in the linear mode, corresponds to a current output. The light receiving signal, which is received using the APD operated in the Geiger mode, corresponds to the histogram.

In the case that the quantity of the pulsed light beam reflected by the object is small and/or in the case that there is no object, frequent output of a TOF corresponding to the peak of the light receiving signal causes erroneous detection of the reflected pulsed light beam. To prevent the erroneous detection of the reflected pulsed light beam from occurring, a threshold for the extracted peak of the light receiving signal is generally provided, and in a case of an extracted peak value being not more than the threshold, it is determined that no object exists, thereby not outputting the TOF. When the threshold is set small, a detection distance becomes longer, however, an erroneous detection rate of the reflected pulsed light beam is increased. When the threshold is set large, the erroneous detection rate of the reflected pulsed light beam may be reduced, however, the detection distance becomes short. Accordingly, adaptively setting the threshold according to the noise level of the disturbance light or the like is preferable to set the threshold as small as possible within a range in which no erroneous detection rate of the reflected pulsed light beam occurs or within a range in which the erroneous detection rate of the reflected pulsed light beam is tolerable.

JP 2013-96905 A (hereinafter referred to as "PTL 1") discloses a technique for setting a threshold according to a noise level. A threshold setting means sets a value obtained by adding a preset margin to the average value in a noise waveform, as a detection threshold. PTL 1 discloses various methods for a margin determination method. For example, the margin defines a value obtained by multiplying a preset coefficient by the standard deviation, or the effective value in the alternate-current component of the noise waveform. Alternatively, the margin defines a value obtained by multiplying the preset coefficient by the difference value between the maximum value and the minimum value in the noise waveform, or a value obtained by multiplying the preset coefficient to the difference value between the maximum value and the average value in the noise waveform. As another alternative, the margin defines a value obtained by multiplying the preset coefficient by N times the square root of a calculated noise difference value represented as the difference between the maximum value and the minimum value in the noise waveform, wherein N is the number of pulsed light beam transmission times. An yet another alternative, the margin defines a value obtained by multiplying the preset coefficient by N times the square root of a calculated noise difference value represented as the difference between the maximum value and the average value in the noise waveform, wherein N is the number of pulsed light beam transmission times.

In a conventional threshold setting method, the threshold has been decided resulting from the magnitude of the noise level determined from the noise waveform. The magnitude of the noise level is acquired as the standard deviation, the difference between the maximum value and the minimum value, the difference between the maximum value and the average value or the like in the noise waveform. The case that the magnitude of the noise level is acquired as the standard deviation in the noise waveform refers to an assumed normal distribution. The standard deviation when a noise distribution determined from the noise waveform does not obey a normal distribution does not accurately determine the dispersion degree of the noise distribution, that is, the magnitude of the noise level. Also, since the maximum value and the minimum value in the noise waveform are both unstable due to a large fluctuation, the magnitude of the noise level is not accurately determined. Calculating the margin from the magnitude of an inaccurate noise level leads to a problem that the margin can be inappropriately set. Also, there is a problem that an excessively small threshold increases the erroneous detection rate of the reflected pulsed light beam, and that, in contrast, an excessively large threshold reduces the detection distance.

In the optical distance measuring apparatus using the photon-counting light receiving element, a noise component distribution does not obey a normal distribution, but instead obeys a distribution close to a Poisson distribution. When the threshold resulting from the standard deviation is calculated, there is a tendency that a single detection threshold is set to be small in the case that the noise level is especially small, thereby causing a problem that the erroneous detection rate of the reflected pulsed light beam increases.

The present disclosure provides an optical distance measuring apparatus capable of setting the erroneous detection of a reflected signal to a desired value by determining a detection threshold of the reflected signal adaptively according to a change of measurement conditions, such as a measurement object and sunshine conditions and the like.

In an aspect of the present disclosure, the optical distance measuring apparatus measures a distance using a light propagation time. The optical distance measuring apparatus includes a light emitting means, light receiving means, signal discrimination means, propagation estimation means and threshold setting means. The light emitting means emits repeatedly a pulsed output light beam to a measurement object. The light receiving means including a photon-counting light receiving element receives a light beam to output a light receiving signal. The signal discrimination means discriminates a signal component, exceeding a threshold, from received signal components of the light receiving signal as a reflected signal resulting from reflection of the output light beam at the measurement object. The propagation estimation means estimates a round-trip propagation time of the output light beam to the measurement object based on the reflected signal. The threshold setting means sets a boundary level as the threshold, which corresponds to a reference level obtained from the light receiving signal when the reflected signal is determined using the signal discrimination means, based on a relationship between the reference level and the boundary level. The reference level is obtained from an average value of a probability distribution of a noise included in the light receiving signal. The boundary level has a cumulative probability in the noise probability distribution which has a predetermined value.

In the optical distance measuring apparatus, a conversion database is preferably provided in which the relationship between the reference level and the boundary level in relation to the noise probability distribution included in the light receiving signal is obtained in advance and is stored. Also, the threshold setting means sets the boundary level corresponding to the reference level obtained from the light receiving signal as the threshold with reference to the conversion database.

In addition, it is preferable to further provide a probability distribution estimation means that estimates the noise probability distribution of the light receiving signal in the optical distance measuring apparatus.

Further, it is preferable that the noise probability distribution of the light receiving signal is a probability distribution of a maximum value of a waveform of the light receiving signal.

Moreover, it is preferable that the boundary level is a value obtained by adding the reference level to a value obtained by multiplying a preset coefficient by the square root of the reference level in the noise probability distribution included in the light receiving signal.

Another aspect of the present disclosure is an optical distance measuring apparatus that measure a distance using the light propagation time. The optical distance measuring apparatus includes a light emitting means, light receiving means, propagation estimation means and reliability output means. The light emitting means emits repeatedly a pulsed output light beam to a measurement object. The light receiving means including a photon-counting light receiving element receives a light beam to output a light receiving signal. The propagation estimation means estimates a round-trip propagation time of the output light beam to the measurement object based on the reflected signal, which is included in the light receiving signal, resulting from reflection of the output light beam at the measurement object. The reliability output means outputs a cumulative probability as a reliability of detection, and the cumulative probability corresponds to the reflected signal in an average value of a noise probability distribution included in the light receiving signal.

In the optical distance measuring apparatus, a conversion database is preferably included in which the noise probability distribution corresponding to the reference level is obtained in advance and is stored for every reference level in relation to the noise probability distribution. The reference level is the average value of a noise probability distribution included in the light receiving signal. Also, the reliability output means outputs the cumulative probability corresponding to the reflected signal as the reliability of detection with reference to the conversion database corresponding to the reference level obtained from the light receiving signal when detecting the reflected signal.

In addition, it is preferable to further include the probability distribution estimation means that estimates the noise probability distribution of the light receiving signal in the optical distance measuring apparatus.

Further, it is preferable that the noise probability distribution of the light receiving signal is a probability distribution of the maximum value of the waveform of the light receiving signal.

Moreover, it is preferable that the reference level is a mode of the noise probability distribution of the light receiving signal.

Alternatively, it is preferable that the reference level is a median of the noise probability distribution of the light receiving signal.

According to the present disclosure, the erroneous detection rate of the signal of a reflected light beam may be set to a predetermined value according to the noise level.

Figure 1:
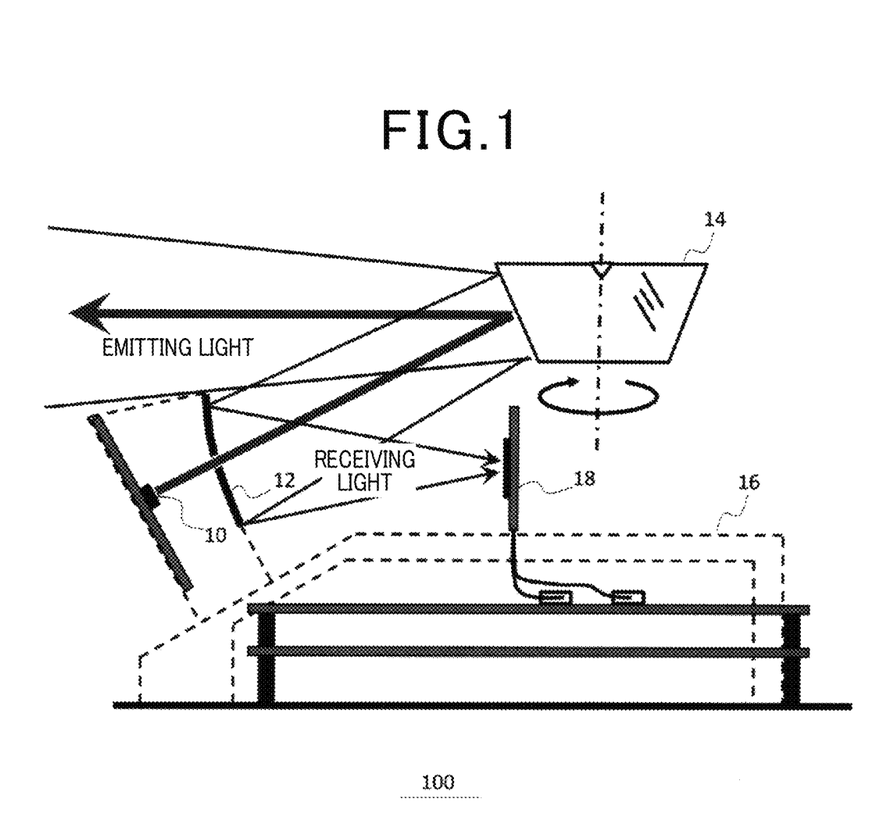
FIG. 1 is a diagram illustrating a structure of an optical distance measuring apparatus in an embodiment of the present disclosure.

As shown in FIG. 1, an optical distance measuring apparatus 100 according to an embodiment of the present disclosure includes a laser diode 10, a hyperboloidal mirror 12, a polygonal mirror 14 and a distance measurement unit 16.

A laser light beam (emission pulse), which is repeatedly emitted from the laser diode 10, is collimated using a collimating lens not shown in the diagrams, and is transmitted towards the polygon mirror 14 via an aperture provided in the center of the hyperboloidal mirror 12. The laser light beam reflected by the polygon mirror 14 is transmitted to a space where a measurement object may be present. When the laser light beam is reflected by the measurement object, the reflected laser light beam is transmitted to the distance measurement unit 16. The reflected laser light beam, which returns to the distance measurement unit 16 on the same path as the path where the light beam emitted from the laser diode 10 was transmitted, is again reflected by the polygon mirror 14. After this reflection, the reflected laser light beam is further reflected by the hyperboloidal mirror 12 and is incident to a light receiving element 18.

The optical system of the optical distance measuring apparatus 100 is a coaxial type optical system where an optical axis of an emission light beam (laser light beam) and that of a reception light beam (reflected laser light beam) are aligned with each other. The hyperboloidal mirror 12 collects the reflected laser light beam to the light receiving element 18 so as to perform a function similar to a lens. Also, rotation of the polygon mirror 14 causes the laser light beam and the reflected laser light beam to be scanned simultaneously in the horizontal direction. The polygon mirror 14 may be, for example, constituted of six faces and variation of the respective depression angle of each of the six surfaces causes the laser light beam and the reflected laser light beam to be scanned in the vertical direction. When a difference between the respective depression angles of the six surfaces is made equal to the spread angle of the emission laser light beam in the vertical direction, the polygon mirror 14 may scan the laser light beam and the reflected laser light beam in the vertical direction without gaps.

The distance measurement unit 16 removes the influence of disturbance light and measures a time between a time when the emission pulse is emitted from the laser diode 10 to a time (TOF: time of flight) when the emission pulse reflected by the measurement object returns to the distance measurement unit 16.

Figure 3:
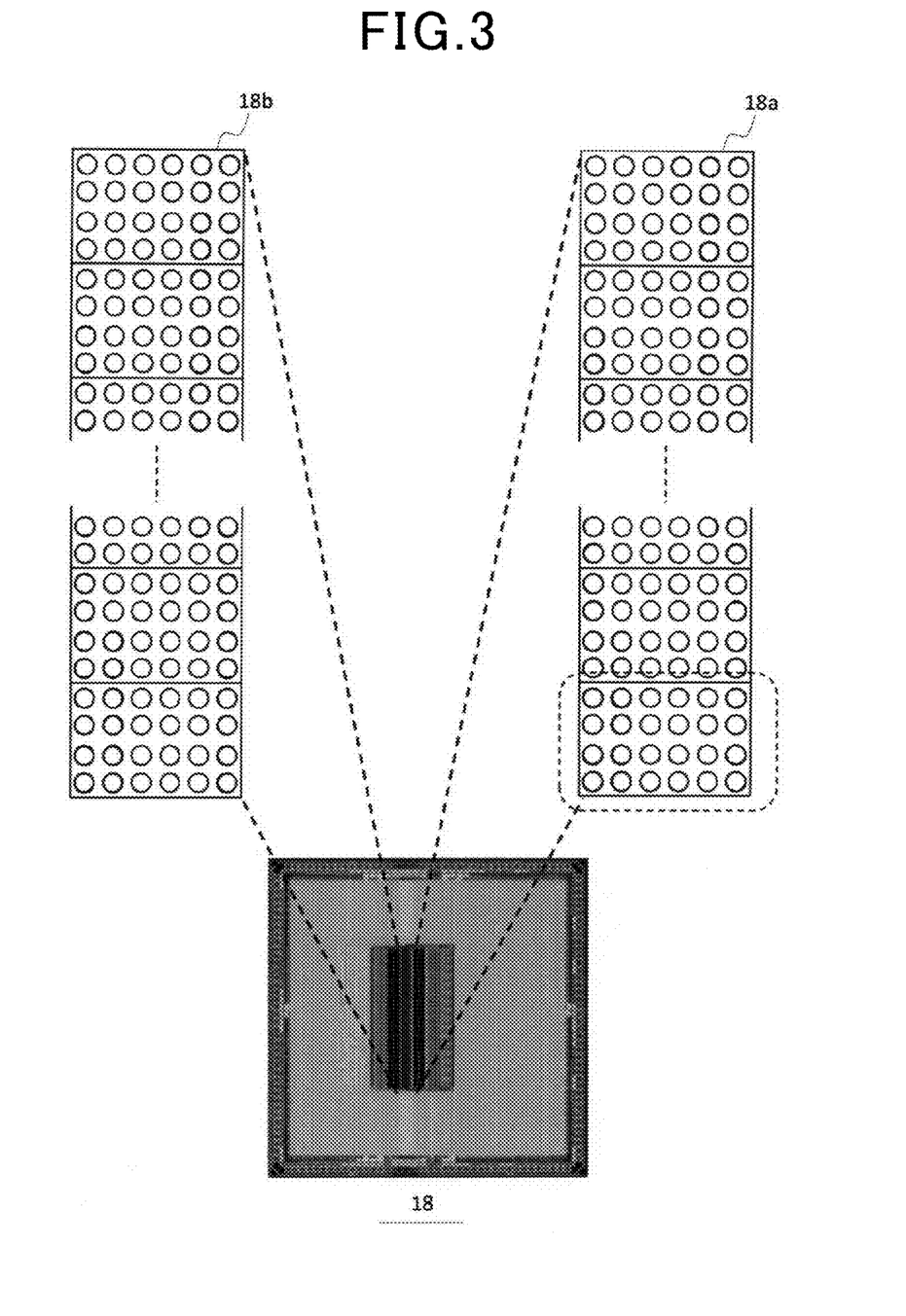
FIG. 3 is a view indicating an example of a layout of light receiving elements in the embodiment of the present disclosure.

FIG. 3 shows a configuration example of the light receiving element 18 included in the distance measurement unit 16 according to the present embodiment. The light receiving element 18 is configured that the photodetector for TOF measurement 18a and the photodetector for noise measurement 18*b* are arranged in parallel. In the photodetector for TOF measurement 18*a*, light receiving elements, that are a plurality of SPADs, are arranged so that a light receiving area and the beam spots of the laser light beam collected thereto are overlapped with each other. In the photodetector for noise measurement 18*b*, the light receiving elements, that are the plurality of SPADs, are arranged so that the light receiving area and the beam spots of the laser light beam collected thereto are not overlapped with each other. Accordingly, the photodetector for noise measurement 18*b* does not receive the reflected laser light beam reflected by the measurement object and receives only disturbance light.

In each of the photodetector for TOF measurement 18*a* and the photodetector for noise measurement 18*b*, 16 photodetectors are implemented in the vertical direction thereof in one-dimensional arrays. The photodetector for TOF measurement 18*a* and the photodetector for noise measurement 18*b* may be preferably, for example, constituted of silicon photo multipliers (SiPMs). The plurality of SPADs are arranged in an array to constitute one photodetector having a large light receiving unit as a whole, that is, each SiPM. In the example of FIG. 3, each SiPM is constituted of a 4×6 array of SPADs. Each of the photodetector for TOF measurement 18*a* and the photodetector for noise measurement 18*b* is constituted of 16 SiPMs. The polygon mirror 14 is constituted of six surfaces, and therefore, the number of scan lines in a vertical direction of the optical distance measuring apparatus 100, which is expressed by the product of the number of the photodetectors and that of the faces of a polygon, is 96 lines, being equal to the product of 16 and 6.

Figure 4:
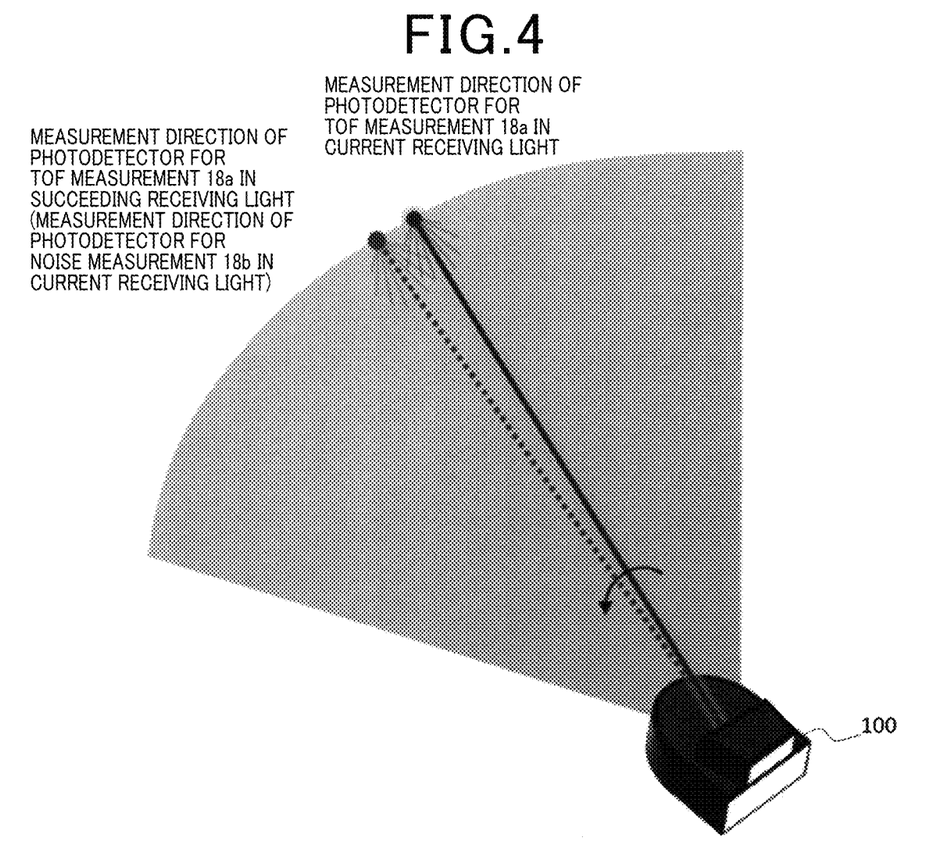
FIG. 4 is a diagram illustrating a noise measuring method in the embodiment of the present disclosure.

In each of the photodetector for TOF measurement 18*a* and the photodetector for noise measurement 18*b*, "horizontal direction" is defined as the left-and-right direction where it is arranged shown in FIG. 3, and "vertical direction" in the upper-and-lower direction. As shown in FIG. 4, at each time during scanning, the horizontal direction, in which the photodetector for TOF measurement 18*a* observes the reflected laser light beam, is always different from the horizontal direction, in which the photodetector for noise measurement 18*b* observes the reflected laser light beam. An angular difference, between the observation direction from the photodetector for TOF measurement 18*a* and that from the photodetector for noise measurement 18*b*, is determined by a distance, between the photodetector for TOF measurement 18*a* and the photodetector for noise measurement 18*b*, and the focal length of the hyperboloidal mirror 12. Also, an angular difference, between the measurement direction, in relation to the reflected laser light beam, of the photodetector for TOF measurement 18*a* in current received light, and that of the photodetector for noise measurement 18*b* in succeeding received light, that is a horizontal resolution, is determined by the rotational speed of the polygon mirror 14, a measurement time interval, an incident angle of the emission light beam to the polygon mirror 14 and the like. When the horizontal resolution and the focal length of the hyperboloidal mirror 12 are fixed, the distance, between the photodetector for TOF measurement 18*a* and the photodetector for noise measurement 18*b*, is adjusted. This adjustment leads the observation direction from the photodetector for noise measurement 18*b* to coincide with the measurement direction, in relation to the reflected laser light beam, of the photodetector for TOF measurement 18*a* in succeeding received light. Thus, the photodetector for noise measurement 18*b* in current received light observes in the same direction as the direction in which the photodetector for TOF measurement 18*a* in succeeding received light observes.

In this embodiment, the photodetector for noise measurement 18*b* and the photodetector for TOF measurement 18*a* have the same configuration, however, they may also have different configurations with each other. Also, the embodiment describes a configuration example for providing the photodetector for noise measurement 18*b* separately, however, a configuration example for mounting only the photodetector for TOF measurement 18*a* may be configured to measure a noise level while a pulse laser light beam is not emitted.

Figure 5:
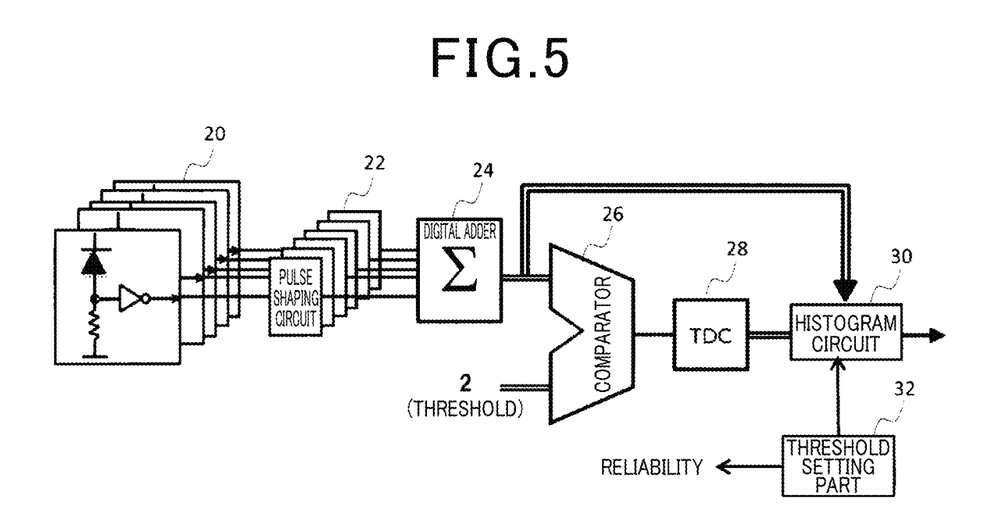
FIG. 5 is a diagram illustrating a circuit structure of photodetectors in the embodiment of the present disclosure.

FIG. 5 shows one circuit configuration example of each SiPM constituting the photodetector for TOF measurement 18*a*. The respective output pulses emitted from each of a plurality of SPADs 20 have a finite output pulse width of 5 to 50 ns. A plurality of pulse shaping circuits 22 shape pulses so that the output pulse width emitted from each of the SPADs 20 is equal to the emission pulse width emitted from the laser diode 10. A digital adder 24 adds a signal to the signal of a voltage pulse shaped from the output pulse emitted from each of the SPADs 20. The digital adder 24 outputs the number of the SPADs 20 where each output voltage is in a high state. The output outputted using the digital adder 24 is inputted into a comparator 26, and when the number of the SPADs 20 is not less than a predetermined value (e.g., 2 in the case of this example), a TDC 28 (Time to Digital Converter) measures an elapsed time from a laser light beam emission time. Specifically, only when photons are simultaneously detected in the predetermined value or more of the SPADs 20, the elapsed time is measured. Thus, a large number of the photons, included in the reflected laser light beam reflected by the measurement object, simultaneously arrive at the photodetector for TOF measurement 18*a*. On the other hand, in the case of the disturbance light, a process is performed based on the fact that photons from disturbance light are unlikely to arrive simultaneously at a predetermined place because disturbance light photons will arrive at the predetermined place randomly. A voltage pulse having a pulse width, which has more than the emission pulse width emitted from the laser diode 10, has a high probability of not being derived from the reflected laser light beam. Thus, each of the pulse shaping circuits 22 adjusts pulses so that the voltage pulse width is equal to the emission pulse width to be emitted from the laser diode 10. After the TDC 28 measures the elapsed time from the laser light beam emission time, a histogram circuit 30 generates a histogram whose horizontal axis represents the elapsed time from the laser light beam emission time, and whose vertical axis represents the number of the SPADs 20 for which the output voltage is in a high state. When generating the histogram, the digital adder 24 adds an output value, that is, the output value outputted thereby to each of bins of the histogram corresponding to the elapsed time. In a number of the SPADs 20, simultaneous detection of the output pulses causes a greater number of the output values to be added to each bin, and therefore, the histogram may be generated using more effective data.

A final histogram is generated by repeating a cyclic process, from emission of the laser light beam to addition of the output value to each bin, Np times. For extracting the maximum value of the histogram of the TOF with high accuracy, the histogram needs to be generated using more data, and therefore, measurement time becomes longer because taking a greater number of TOF measurements is required. If the measurement time becomes long, measurement error occurs in the case that emission/reception light beams are scanned and/or that the measurement object moves. Each SiPM may reduce the measurement time, since the outputs from the SPADs 20 are integrated using a spatial integration means and a temporal integration means.

After the histogram is generated, when each of peak values in the histogram is not less than a threshold set using a threshold setting part 32, the histogram circuit 30 outputs a time corresponding to the position of each peak value as the TOF. When there is a plurality of the peak values of more than the threshold, the histogram circuit 30 may output the plurality of TOF values corresponding to the positions of the peak values. In this way, even if one emission pulse is reflected at the plurality of measurement objects at different distances, the plurality of TOF values may be detected. When there is no peak value of more than the threshold, the histogram circuit 30 determines that there is no measurement object, and does not output the TOF value. In this way, setting the threshold in relation to each peak value in the histogram for detecting the TOF may reduce the erroneous detection of the TOF.

Each SiPM constituting the photodetector for noise measurement 18b includes also the same detection circuit as that constituting the photodetector for TOF measurement 18a, and the detection circuit generates a histogram and detects the TOF in the same way as the photodetector for TOF measurement 18a. The photodetector for TOF measurement 18a does not receive the reflected emission pulse, and therefore, all the histograms are generated based on a noise component. The generated histogram includes the noise component including dark count and after pulse of the SPAD in addition to the disturbance light. After the histogram is generated in a predetermined measurement time, the photodetector for noise measurement 18b outputs the average value of a normalized probability distribution as a noise average value.

The threshold setting part 32 sets a boundary level as a threshold of the histogram circuit 30, which corresponds to the noise average value (reference level) outputted using the detection circuit of the photodetector for noise measurement 18b, with reference to a noise average value-threshold conversion table which is formed in advance. A method of producing the noise average value-threshold conversion table will be described below.

First, the noise probability distribution is measured using the photodetector for TOF measurement 18a. The noise average value is simultaneously measured using the photodetector for noise measurement 18b. Irradiation of a light beam of a light source, such as a halogen lamp, to the distance measurement unit 16 of the optical distance measuring apparatus 100 generates disturbance light noise which does not change with time. In this state, the output of the emission pulse emitted from the laser diode 10 is stopped, and then a histogram equivalent to the amount of Np times of the emission pulse is generated using the photodetector for TOF measurement 18a in the same way as for measuring the TOF.

Figure 6:
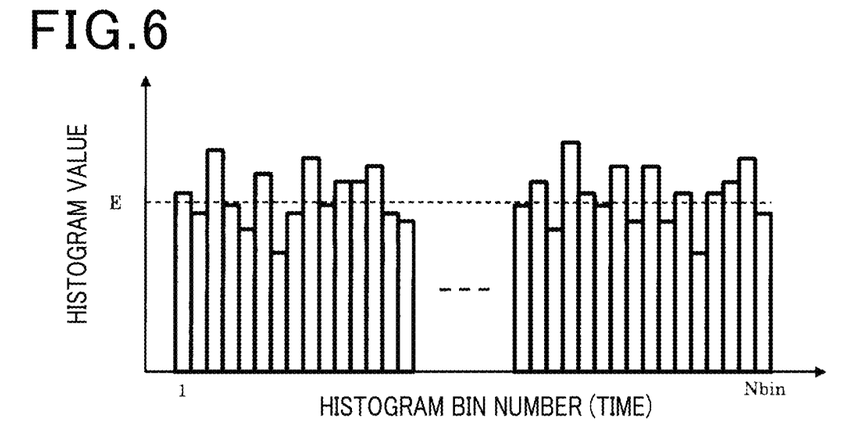
FIG. 6 is a diagram illustrating generation of a histogram of a noise in the embodiment of the present disclosure.

FIG. 6 shows an example of the generated histogram. In one histogram, histogram values corresponding to Nbin number of the bins are obtained. When the histogram is repeatedly generated Nmes times while holding the disturbance light to be constant, Nbin×Nmes histogram values are obtained in total. A value assumed by each of the histogram values is 0 to Nspad×Np. Herein, Nspad represents the number of the SPADs constituting each SiPM. A frequency distribution of all measured histogram values is produced, and then each of frequencies in the frequency distribution is divided by Nbin×Nmes number of the all frequencies in total, thereby obtaining a probability distribution shown in FIG. 7.

Figure 7:
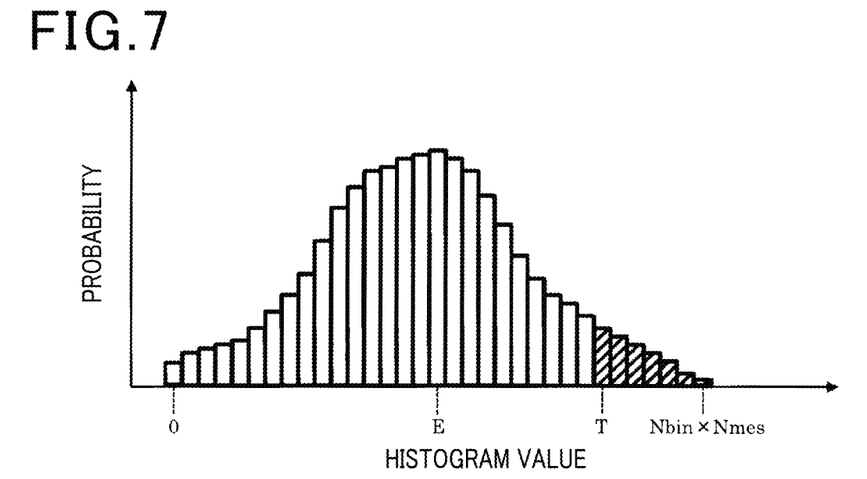
FIG. 7 is a diagram illustrating a probability distribution of a histogram value generated based on the noise in the embodiment of the present disclosure.

Herein, equation 1 represents a probability where the histogram value is i.
[Equation 1]

$$P(i)\{i=0,1,2,\ldots,Nspad \times Np\} \tag{1}$$

Equation 2 represents a cumulative probability. Herein, the cumulative probability represents a probability where the histogram value generated based on the noise component in relation to a particular single bin is not more than i
[Equation 2]

$$C(i) = \sum_{j=0}^{i} P(j) \tag{2}$$

A probability where each of peak values in the histogram value is not more than i represents a probability where all the histogram values corresponding to Nbin number of the bins in one histogram are respectively not more than i. When obtaining the histogram value of each bin is assumed to be an independent probability event, the probability where each peak value in the histogram value is not more than i is represented by equation 3.
[Equation 3]

$$\{C(i)\}^{Nbin} \tag{3}$$

Also, a probability where each peak value in the histogram is more than i, that is, a probability where the boundary level being i causes erroneous detection of the signal of the reflected laser light beam is represented by equation 4.
[Equation 4]

$$1-\{C(i)\}^{Nbin} \tag{4}$$

Obtaining the histogram value of each bin is not an independent probability event, however, using equation 4 approximates an erroneous detection rate of the signal of the reflected laser light beam with high accuracy. Accordingly, a threshold T, where the erroneous detection rate is not more than Err, is set to be preferable as the boundary level which is the smallest value of i that satisfies equation 5.
[Equation 5]

$$1-\{C(i)\}^{Nbin} \leq Err \tag{5}$$

Figure 8:
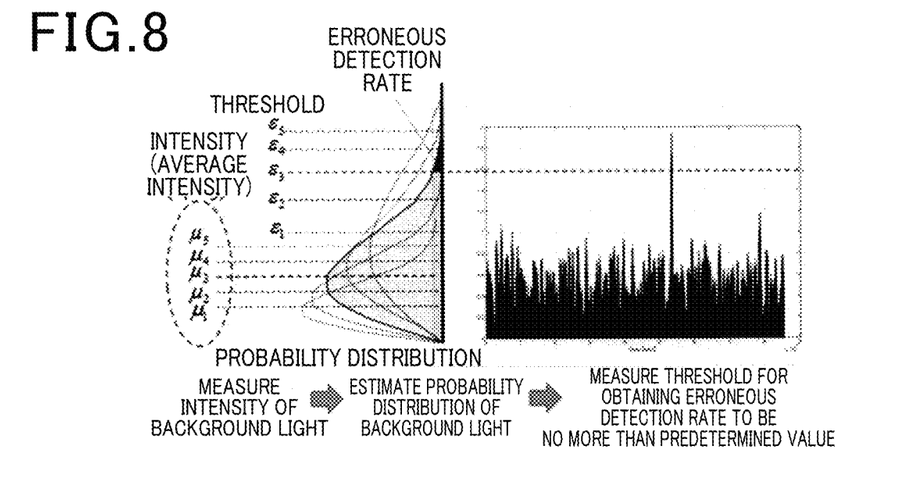
FIG. 8 is a diagram illustrating a reference level (average value) and a method of setting a threshold for detecting a reflected signal in the embodiment of the present disclosure.

A noise average value $\mu$ is determined as the average value of a noise probability distribution obtained by normalizing a histogram. The histogram is obtained by the number of the SPADs 20 where each of output voltages outputted thereby is in a high state being accumulated for all the number of measurement (Nmes times, that is, the number of emission times of the laser light beam) multiplied by the number of bins, which is Nbin, of the histogram generated using the photodetector for noise measurement 18b. Thus, as shown in FIG. 8, obtaining a probability distribution P (i) [i=0, 1, 2 . . . , Nspad×Np] of the histogram value generated based on the noise provides a relationship between the noise average value $\mu$ (e.g., $\mu$1, $\mu$2 . . . ) of each probability distribution with respect to the noise level and a boundary level $\varepsilon$ (e.g., $\varepsilon$1, $\varepsilon$2 . . . ) where the erroneous detection rate is Err. The relationship between the noise average value $\mu$ and the boundary level $\varepsilon$ is examined in relation to all the noise levels in advance based on measurement of the probability distribution. This provides producing a conversion table (conversion database) between the noise average value $\mu$ and the boundary level $\varepsilon$. Specifically, the relationship between the noise average value $\mu$ and the boundary level $\varepsilon$ may be examined in relation to all the noise levels in a state that the quantity of light of the light source and a distance between the light source and the optical distance measuring apparatus are changed.

Instead of obtaining the relationship between the noise average value μ and the boundary level ε by measuring the probability distribution in relation to all the noise levels, some typical noise levels determine combination of the noise average value μ and the boundary level ε, and then the conversion table between the noise average value μ and the boundary level ε may also be completed by interpolation.

When noise, outputted from the detection circuit of the photodetector for noise measurement 18b, is the noise average value μ, the threshold setting part 32 sets the threshold T for detection of each peak of the histogram generated based on a reflected signal component in relation to the histogram circuit 30 with reference to the conversion table. This may maintain the erroneous detection rate Err in detection of the reflected signal in relation to all the noise levels. Also, instead of using the conversion table, a relational expression, showing the relationship between the noise average value μ and the boundary level ε, may be obtained for each noise level, and then the boundary level ε may be measured using the noise average value μ as an argument. Thus, the boundary level ε measured by the noise average value μ of the actually determined noise may be set as the threshold T.

In the above description, the relationship between the noise average value μ and the boundary level ε is determined based on a probability distribution of the histogram value of each bin, however, the relationship may also be determined based on a probability distribution of the maximum value of the histogram. One-time histogram generation obtains one maximum value of the histogram, and therefore, repetition of the histogram generation Nmes times may obtain a number Nmes of the maximum values of the respective histograms. A frequency distribution of the measured number Nmes of the maximum values is generated, and then each of frequencies in the frequency distribution is divided by the number Nmes of all frequencies, thereby obtaining the probability distribution of the maximum value of the histogram that satisfies equation 6.

[Equation 6]

$$P_{max}(i)\{i=0,1,2,\ldots,N\text{spad}\times Np\} \quad (6)$$

When this cumulative probability is represented as Cmax (i), the threshold T where the erroneous detection rate is not more than Err is preferably the boundary level which is the smallest value i that satisfies equation 7.

[Equation 7]

$$1-C_{max}(i) \leq Err \quad (7)$$

Since one-time histogram generation obtains only one maximum value of the histogram, there is a need for extra histogram generation for determining the probability distribution with high accuracy, thereby requiring a long measurement time. On the other hand, this extra histogram generation has an advantage in which the threshold may be fixed without the assumption of the histogram value of each bin being an independent probability event.

The conversion table between the noise average value μ and the boundary level ε is enough to be produced only once. A duplicated optical distance measuring apparatus for the optical distance measuring apparatus and the optical distance measuring apparatus may share the same conversion table, if the duplicated optical distance measuring apparatus has the same light receiving element as the optical distance measuring apparatus. Thus, in the optical distance measuring apparatus 100 of the present embodiment, a probability distribution estimation means is not an essential component. Even when characteristics of a light receiving means are changed due to aged deterioration or the like using the probability distribution estimation means, a relationship between the noise level and the threshold, that is, the conversion table may be updated. In the present embodiment, the probability distribution is measured by actual measurement, however, the probability distribution may also be determined using various simulations to produce the conversion table.

Also, a single configuration having no the conversion table may also applied. Response of the light receiving element of a photon count type LiDAR is based on a Poisson process, the value of the light receiving signal of the histogram or the like, at a light receiving timing, generated by response of the light receiving element may also approximate the Poisson process. It has been known that when the average number of times of occurrence for a given time is n times in the Poisson process, the dispersion (standard deviation) in the number of times of occurrence is the square root of n. Thus, as shown in FIG. 8, the threshold setting part 32 may also set a value, obtained by adding the noise average value μ outputted using the photodetector for noise measurement 18b with a value obtained by multiplying the square root of the noise average value μ by a predetermined coefficient (e.g., 4.0), as the boundary level ε.

This provides a simple configuration in which the threshold may be set in accordance with the dispersion degree of the noise distribution in a light receiving signal outputted using the photon count type LiDAR.

Although the photodetector for TOF measurement 18a and the photodetector for noise measurement 18b in the present embodiment are respectively constituted of the SiPMs constituting one photodetector having the large light receiving unit as a whole. The SiPMs are produced by arranging the plurality of SPADs in the array. However, the photodetector for TOF measurement 18a and the photodetector for noise measurement 18b are not limited to this configuration, and they may also be respectively constituted of SiPMs adding an output current outputted from each SPAD.

In addition, the present embodiment shows a configuration that the TDC 28 is activated when the output voltages outputted using a predetermined number or more SPADs are simultaneously in a high state. However, performing time sampling of output addition signals of the all SPADs may also generate a light receiving signal corresponding to the histogram. Also, in the case that the light receiving signal is from the light receiving element of a photon count type, in mounting of the SiPMs, various modification may be implemented. Instead of the SiPMs, one photodetector may also be constituted of one SPAD.

In the present embodiment, the number of emission times of the laser light beam for generating one histogram, that is, times of integration of the histogram, is Np. As described above, increasing the number of times of integration of the histogram may extract the maximum value of the histogram with higher accuracy, however, the measurement time becomes long. Also, summing and merging the histograms, where the adjacent photodetectors have generated, that is, increasing the number of times of a spatial integration, sacrifices a spatial resolution, however, it may enhance extraction accuracy of the maximum value of the histogram in the same way as increasing the number of times of a temporal integration. In the case of a small amount of disturbance light such as at night, the number of times of integration of the histogram may be increased. In the case of much disturbance light such as daylight, times of integration of the histogram may be reduced. Thus, in the case that the number of times of integration of the histogram are made variable, the measurement time of the noise is preferably increased or decreased in proportion to the number of times of integration of the histogram. Also, when the number of times of integration of the histogram is x times a standard, the threshold may also be determined with reference to x times the noise average value measured using the conversion table between the noise average value μ and the boundary level ε.

Also, in the present embodiment, the reference level is the noise average value μ (expectation value) of the noise probability distribution, however, it may also be a mode or a median of the noise probability distribution. In this case, for example, the conversion table is produced by determining the relationship between the mode or the median of the noise probability distribution and the boundary level ε in advance, thereby enabling the threshold T in accordance with the noise probability distribution to be set. In this case, the mode is a random variable, in which a probability becomes the maximum in the noise probability distribution, that is, the histogram value. The median is a random variable in which the cumulative probability in the noise probability distribution becomes 0.5. The mode and median may be easily measured by generating the histogram using the photodetector for noise measurement.

Also, a value obtained by performing linear transformation to a statistic such as the noise average value μ, the mode, the median or the like (e.g., 1.2 times of the noise average value μ) may also be used as the reference level.

MODIFICATIONS

Equation 4 or the cumulative probability which is represented as Cmax (i) is the probability where the maximum value in the histogram values in the histogram generated based on only the noise component is not more than i. This probability is a probability where each peak in the histogram is not generated based on the noise component when each peak value in the histogram is i in the histogram including the reflected signal component. This probability represents, specifically, reliability where each peak in the histogram is generated based on the reflected signal component. Thus, in the noise probability distribution when detecting the reflected signal, a cumulative probability, corresponding to each peak value of the histogram generated based on the reflected signal component detected using the histogram circuit 30, may also be output as a reliability in relation to detection of each peak in the histogram.

Specifically, a conversion table is produced by determining in advance and storing therein a noise cumulative probability distribution corresponding to the reference level for each of the reference levels (the average value, the mode, the median or the like) in the respective noise probability distributions generated based on the noise included in the light receiving signal. After this, when detecting each peak of the histogram generated based on the reflected signal component, the cumulative probability corresponding to each peak value of the histogram generated based on the reflected signal component may be output as a reliability in relation to detection of each peak in the histogram, with reference to the conversion table corresponding to the reference level generated based on the noise actually determined from the light receiving signal. For example, in the case that each peak value of the histogram, when the reflected signal is detected using the histogram circuit 30, is P, a cumulative probability Cmax (P) corresponding to each peak value being P may be output as a reliability in relation to detection of each peak in the histogram.

Although the present disclosure has been described in conformity with examples, it is understood that the present disclosure is not limited to the examples and the structure. The present disclosure encompasses various modifications and modifications that fall within the equivalent range. In addition, various combinations and forms, as well as other combinations and forms including only one element, more or less, are within the scope and spirit of the present disclosure.

What is claimed is:

1. An optical distance measuring apparatus comprising:
   a light emitter configured to repeatedly emit a light pulse to a measurement object;
   a light receiver including a photon-counting light receiver configured to:
      receive light that includes (i) at least one echo resulting from reflection of at least one of the emitted light pulses by the measurement object, and (ii) measured noise including a measured reference level; and
      output, based on the received light, a received signal comprised of signal components;
   a signal discriminator configured to:
      determine whether the signal components of the received signal are each higher than a threshold; and
      discriminate, from the received signal components of the received signal, at least one signal component as at least one echo signal based on the at least one echo in response to determination that the at least one signal component is higher than the predetermined threshold;
   a propagation estimator configured to estimate, based on the at least one echo signal, a round-trip propagation time of the at least one of the light pulses between the optical distance measuring apparatus and the measurement object; and
   a threshold determiner configured to:
      extract, from a noise level relationship between (i) a plurality of noise reference levels included in respective noise-level probability distributions and (ii) a plurality of noise boundary levels included in the respective noise-level probability distributions, one of the noise reference levels corresponding to the measured noise level, each of the noise reference levels correlating to a corresponding one of the noise boundary levels in a corresponding one of the noise-level probability distributions, each of the noise boundary levels representing a predetermined cumulative probability in a corresponding one of the noise-level probability distribution; and
      extract, from the noise level relationship, one of the noise boundary levels correlating to the extracted one of the noise reference levels, thus determining the extracted one of the noise boundary levels as the threshold.

2. The optical distance measuring apparatus according to claim 1, wherein:
   the noise level relationship is configured as a database that stores each of the noise reference levels correlating to a corresponding one of the noise boundary levels in a corresponding one of the noise-level probability distributions; and
   the threshold determiner is configured to:

refer to the database to thereby extract, from the database, one of the noise reference levels corresponding to the measured noise level; and extract, from the database, one of the noise boundary levels correlating to the extracted one of the noise reference levels, thus determining the extracted one of the noise boundary levels as the threshold.

3. The optical distance measuring apparatus according to claim 1, further comprising:

a probability distribution estimator configured to estimate, based on prepared noise around the optical distance measuring apparatus received by the photon-counting light receiver of the light receiver, the noise-level probability distributions.

4. The optical distance measuring apparatus according to claim 1, wherein:

each of the noise-level probability distributions is a probability distribution of peak levels of prepared noise around the optical distance measuring apparatus received by the photon-counting light receiver of the light receiver.

5. The optical distance measuring apparatus according to claim 1, wherein:

the noise boundary level included in each noise-level probability distribution is a value indicative of the sum of:

the corresponding reference noise level correlating to the noise boundary level in the corresponding noise-level probability distribution; and a product of a predetermined coefficient and a square root of the corresponding reference noise level.

6. An optical distance measuring apparatus comprising:

a light emitter configured to repeatedly emit a light pulse to a measurement object;

a light receiver including a photon-counting light receiver configured to:

receive light that includes (i) at least one echo resulting from reflection of at least one of the emitted light pulses by the measurement object, and (ii) measured noise including a measured reference level; and output, based on the received light, a received signal comprised of signal components;

a propagation estimator configured to estimate, based on at least one echo signal, a round-trip propagation time of the at least one of the light pulses between the optical distance measuring apparatus and the measurement object, the at least one echo signal being based on the at least one echo; and a reliability extractor configured to:

select, from a plurality of noise-level probability distributions in which (i) a plurality of noise reference levels and (ii) a plurality of cumulative probabilities are included to correlate each of the noise reference levels to a corresponding one of the cumulative probabilities in a corresponding one of the noise-level probability distributions, one of the noise-level probability distributions corresponding to the measured noise level; and extract, from the selected one of the noise-level probability distributions, one of the cumulative probabilities corresponding to the at least one echo signal as a reliability level of the at least one echo signal.

7. The optical distance measuring apparatus according to claim 6, wherein:

each of the noise-level probability distributions is configured as a conversion database that stores a corresponding one of the noise reference levels correlating to a corresponding one of the cumulative probabilities; and the reliability extractor is configured to:

refer to one of the conversion databases corresponding to the measured noise level to thereby extract, from the one of the conversion databases, one of the cumulative probabilities corresponding to the at least one echo signal as the reliability level of the at least one echo signal.

8. The optical distance measuring apparatus according to claim 1, wherein:

each of the noise reference levels is an average value or a mode of a corresponding one of the noise-level probability distributions.

9. The optical distance measuring apparatus according to claim 1, wherein:

each of the noise reference levels is a median of a corresponding one of the noise-level probability distributions.

10. The optical distance measuring apparatus according to claim 6, further comprising:

a probability distribution estimator configured to estimate, based on prepared noise around the optical distance measuring apparatus received by the photon-counting light receiver of the light receiver, the noise-level probability distributions.

11. The optical distance measuring apparatus according to claim 6, wherein:

each of the noise-level probability distributions is a probability distribution of peak levels of prepared noise around the optical distance measuring apparatus received by the photon-counting light receiver of the light receiver.

* * * * *